(12) United States Patent
Schmidt et al.

(10) Patent No.: US 7,898,114 B2
(45) Date of Patent: Mar. 1, 2011

(54) PROTECTIVE CIRCUIT DEVICE FOR A SOLAR MODULE

(75) Inventors: Heribert Schmidt, Freiburg (DE); Bruno Burger, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 313 days.

(21) Appl. No.: 11/914,679

(22) PCT Filed: May 23, 2006

(86) PCT No.: PCT/EP2006/005051
§ 371 (c)(1), (2), (4) Date: Apr. 2, 2008

(87) PCT Pub. No.: WO2006/125664
PCT Pub. Date: Nov. 30, 2006

(65) Prior Publication Data
US 2008/0198523 A1    Aug. 21, 2008

(30) Foreign Application Priority Data
May 24, 2005  (DE) .................. 10 2005 024 428
Jul. 25, 2005  (DE) .................. 10 2005 036 153

(51) Int. Cl.
*H01H 83/00* (2006.01)
(52) U.S. Cl. .................................... 307/128
(58) Field of Classification Search ............... 307/117, 307/128; 136/243–265
See application file for complete search history.

(56) References Cited

U.S. PATENT DOCUMENTS

| | | | |
|---|---|---|---|
| 4,567,316 A | 1/1986 | Hollaus et al. | |
| 4,718,185 A * | 1/1988 | Conlin et al. | 40/442 |
| 5,131,341 A * | 7/1992 | Newman | 114/39.21 |
| 6,225,793 B1 * | 5/2001 | Dickmann | 323/230 |
| 6,635,817 B2 * | 10/2003 | Chang | 136/244 |
| 7,190,531 B2 * | 3/2007 | Dyson et al. | 359/742 |

FOREIGN PATENT DOCUMENTS

| | | |
|---|---|---|
| DE | 3307202 A1 | 3/1983 |
| DE | 10331780 A1 | 3/2005 |
| EP | 1496577 | 1/2005 |
| JP | 09102622 | 4/1997 |
| JP | 2000174308 | 6/2000 |
| JP | 2002-010520 | 1/2002 |

OTHER PUBLICATIONS

International Search Report and Written Opinion for PCT/EP2006/005051 filed Aug. 28, 2006.
Woyte, Achim, et al., "Partial Shadowing of Photovoltaic Arrays With Different System Configurations: Literature Review and Field Test Results", Apr. 11, 2003, Solar Energy, vol. 74, pp. 217-233.

* cited by examiner

*Primary Examiner* — Albert W Paladini
(74) *Attorney, Agent, or Firm* — Barnes & Thornburg LLP

(57) ABSTRACT

A circuit breaker for a solar module, wherein a plurality of solar cells working in normal operation and when shaded are connected in series. At least one controlled electrical switch element serves as a bypass element and is connected in parallel with its contact gap to a plurality of solar cells. A supply circuit provides a control voltage for controlling the control electrode of the bypass element. An isolating circuit blocks the voltage applied to the contact gap of the bypass element in the normal operation and switches the voltage that is applied to the contact gap to the supply circuit when at least one solar cell is shaded.

41 Claims, 8 Drawing Sheets

PROTECTIVE CIRCUIT DEVICE FOR A SOLAR MODULE

CROSS REFERENCE TO RELATED APPLICATIONS

This application is the U.S. national phase of PCT/EP2006/005051 filed May 23, 2006. PCT/EP2006/005051 claims benefit under the Paris Convention to DE 10 2005 024 428.9 filed May 24, 2005 and DE 10 2005 036 153.6 filed Jul. 25, 2005. The disclosures of all of DE 10 2005 024 428.9, DE 10 2005 036 153.6 and PCT/EP2006/005051 are hereby incorporated herein by reference.

The invention relates to a protective circuit device for a solar module, with which a plurality of solar cells are connected in series.

Figure 1C:
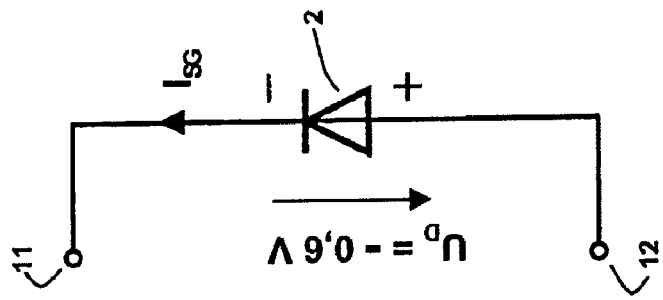
Figure 1B:
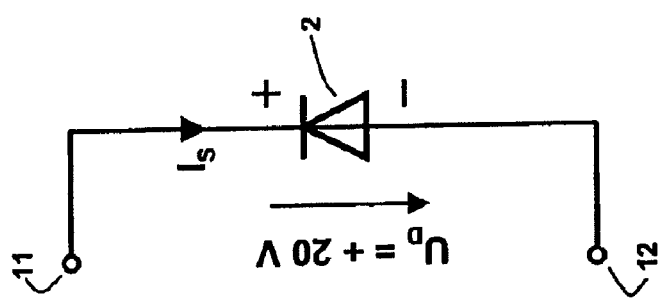
Figure 1A:
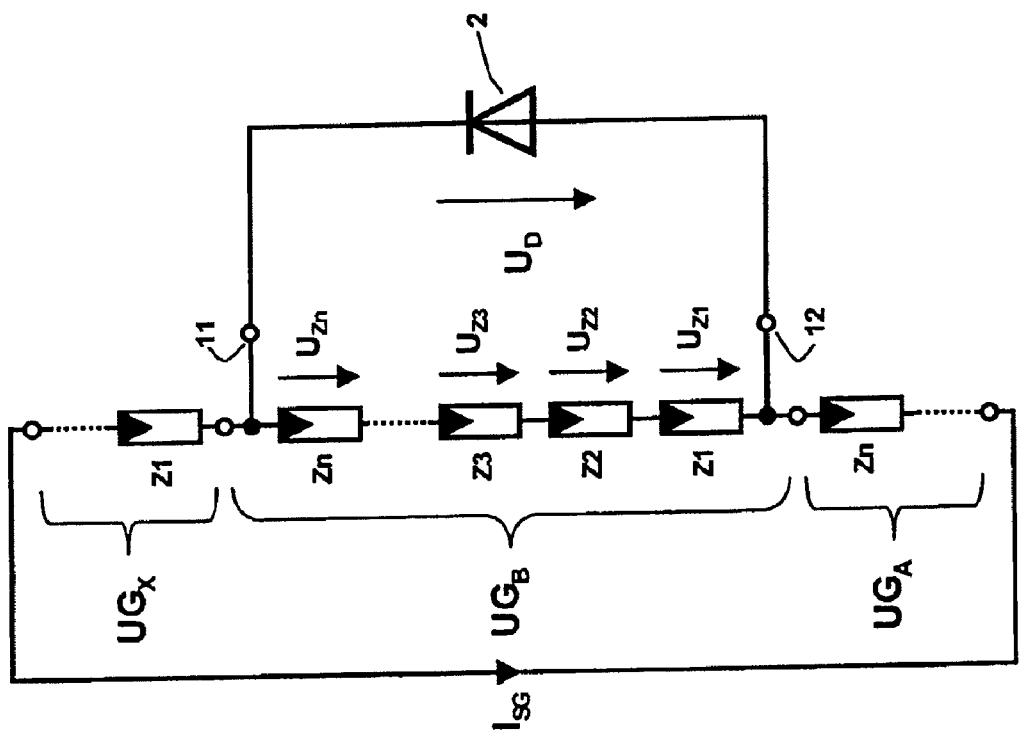

Solar modules are generally known, and according to FIG. 1a, usually consist of a series connection of cells which provide an individual voltage Uz of approx. 0.5 V to 1 V. With a partial shading of one or more cells, or also with different characteristics of the cells, in particular the short-circuit current, the voltage across the shaded cells reverses on loading. In the worst case, i.e. with a short-circuit of the solar generator, e.g. on operation on a shunt battery charge regulator, the sum of the voltages of all cells which are not shaded, drops in the blocking direction over the shaded cells.

Hereinafter, independently of the actual cause of the voltage reversal the term "shading case" is always used and for the non-shaded operation, the term "normal operation" is used.

The permissible reverse voltage of a solar cell ranges from a few volts to a few tens of volts. The permissible reverse voltage may be exceeded, depending on the number of the non-shaded cells which are connected in series to the shaded cells, and this leads to a local breaking-through of the protective layer and to irreversible damage to the cell. It is known to ideally connect a so-called bypass diode in parallel to each individual cell, in order to avoid this unallowably high reverse voltage. This effort is extensive, and is only viable for special applications, e.g. space travel. For this reason, according to FIG. 1a, subgroups UGA, UGB, . . . UGx of cells, e.g. 18 to 24, which are protected in each case by one bypass diode, are formed in commercially available solar modules. These bypass diodes are connected to the respective subgroup via connection points 11, 12. For the purpose of a better overview, the bypass diode is only represented for the subgroup UGB in FIG. 1a.

In normal operation, according to FIG. 1b, the sum of the voltages of the cells Z1 to Zn belonging to the subgroup, thus about +15 V to more than +20 V, is present across the bypass diode. The reverse current IS should be minimal in order to avoid losses. With a complete shading of one or more cells within a subgroup, according to FIG. 1c, the short circuit current or operating point current ISG produced by the non-shaded cells lying outside the subgroup flows through the bypass diode 2. This current produces a voltage drop UD of approx. −0.4V to more than −1 at the bypass diode 2, depending on the applied diode technology, the through-flowing current and the diode temperature. Thus in the worst case, the sum of all voltages of all non-shaded cells located within the associated subgroup, plus the voltage drop across the bypass diode, drops across the shaded cell.

The number of the cells which are grouped together into a subgroup is selected such that the permissible reverse voltage of the shaded individual cell is not exceeded in the worst case. This leads to a typical number of approx. 18 to 24 cells per subgroup.

Thus the following operating conditions result for the known bypass diode:

In normal operation represented in FIG. 1b, the voltage of the cells grouped together into a subgroup, thus typically approx. +15 V to +20V, is present in the blocking direction across the bypass diode. With the case of a complete shading of a cell within the associated subgroup represented in FIG. 1c, the solar generator current ISG flows through the bypass diode and creates a voltage drop UD of approx. −0.4 V to more than −1 V. An occurring reverse voltage of +20 V and a forward voltage UD of −0.6 V is assumed in the following description for simplification, wherein other values may occur.

The bypass diodes are usually accommodated in a contact box, which is connected to the solar module, and is thus exposed to surrounding temperatures of approx. −20° C. to more than 85° C. Typically, two or three diodes for two or three subgroups UGA, UGB and UGC are accommodated in a box. Also one may connect several bypass diodes in parallel for increasing the permissible solar generator currents ISG.

In the case of shading, a relatively large power loss arises in the bypass diodes applied in the state of the art. Such a power loss may be accepted by the diode without problem briefly, but with shadings which last longer, it is difficult to lead away the arising quantity of heat from the diode and out of the contact box. Thereby, one should additionally take into account the fact that the greatest loading, i.e. the greatest solar currents mostly occur with simultaneously high temperatures of the surroundings and modules. The problem is intensified with solar cells increasing in size, since these provide an increasing short circuit current or rated current in proportion to the cell area.

It is therefore the object of the invention to provide a protective circuit device for a solar module, which assumes the functions of a bypass diode, wherein it produces little power loss and is constructed in a simple manner, and ensures a large and lasting reliability.

According to the invention, this object is achieved by the features of the main claim.

By way of the fact that a controllable, electrical switch element serving as a bypass element is provided, whose current path may be connected in parallel to the multitude of solar cells, and that a supply circuit prepares a control voltage for activating the control electrode, one provides a bypass circuit, which may assume the short circuit current or operating point current of the shaded cells without difficulty. The controllable bypass element in its function is controlled by way of the supply voltage such that little power loss occurs. Due to the separating circuit which continues to be provided, the voltage present across the current path of the switch element, to the supply circuit, may be blocked in normal operation of the solar cells, whereas in the case of shading, the separating circuit connects through the voltage present across the current path to the supply circuit.

Advantageous further designs and improvements are possible by way of the measures specified in the dependent claims.

It is particularly advantageous for the supply circuit to be designed as a charging circuit for an energy storer or to comprise such, which carries out an increase of a voltage available in the case of shading, into a higher voltage for activating the controllable bypass element. In this manner, the supply voltage of −0.6 V which is available across the current path in the case of shading, may be used to activate the controllable bypass element and, as the case may be, supply further circuits.

In an advantageous manner, the controllable bypass element is designed as a MOS field effect transistor (MOSFET), wherein the body diode which is inherently present in the MOSFET may briefly completely assume the solar generator current, and may be permanently used as a bypass diode with smaller solar generator currents.

In an advantageous manner, the capacitance inherent of the controllable bypass element, the gate capacity with the applied MOSFET, is used as an energy storer of the supply circuit or charging circuit, so that no additional storage components are necessary.

In a particularly advantageous manner, the separating circuit is designed as an inversely operated bipolar transistor, since this in the normal case is operated conventionally in the common collector circuit and may thus block the positive drain-source voltage of 20 V occurring in normal operation.

It is advantageous to design the separating circuit as a field effect transistor, preferably as a self-conducting J-FET, since this has a low switch-on resistance, so that the subsequent circuit is connected to the voltage of the current path of the bypass element, the drain-source voltage of the MOSFET, almost without losses.

In an advantageous manner, the supply circuit and/or charging circuit comprises a transformer with a positive feedback winding and a first electronic switch element, wherein the switch element and transformer carry out a fast transition similarly to a blocking oscillator, with which the energy stored in the transformer is transmitted to the energy storer, e.g. the gate capacitance. It is possible due to this measure, to produce a high voltage of about 5 V from this low voltage, in the case of shading of approx. 0.6 V, wherein the necessary energy for charging the gate capacitor, may be transmitted rapidly, preferably in a single clock pulse.

In a particularly advantageous manner, the first electronic switch element is switched in an inverse manner, so that it simultaneously forms the separating circuit and no additional components are necessary for the separation.

It is possible to control the controllable bypass element in a manner such that low power losses occur and thus the formation of heat is low, by way of the provision of a first discharge circuit which is connected to the control electrode of the controllable bypass element, wherein the time constant of the discharge circuit is selected such that the ratio of the time of the conducting of the bypass element to that of non-conducting is large, preferably larger than 5.

It is advantageous to design the first discharge circuit as an active discharge circuit which acts in a non-linear manner and which has a high impedance above a threshold voltage and has a low impedance below the threshold voltage, wherein the threshold voltage is determined by the voltage of the control electrode of the bypass switch element which is necessary for the complete activation of the bypass switch element. The occurring power loss within the MOSFET may be reduced further by way of this.

It is particularly advantageous to realise the first discharge circuit with a self-conducting J-FET, which in normal operation connects the control electrode of the bypass switch element to a reference potential, and thus prevents an unintended switching-on of the bypass switch element, and which in the case of shading, together with a network of diode, capacitor and discharge resistor, form a time element which periodically switches off the bypass switch element after a defined time. The control electrode of the bypass switch element in the connected through condition may always be charged in an optimal manner by way of this, by which means the power loss is further reduced.

Figure 2:
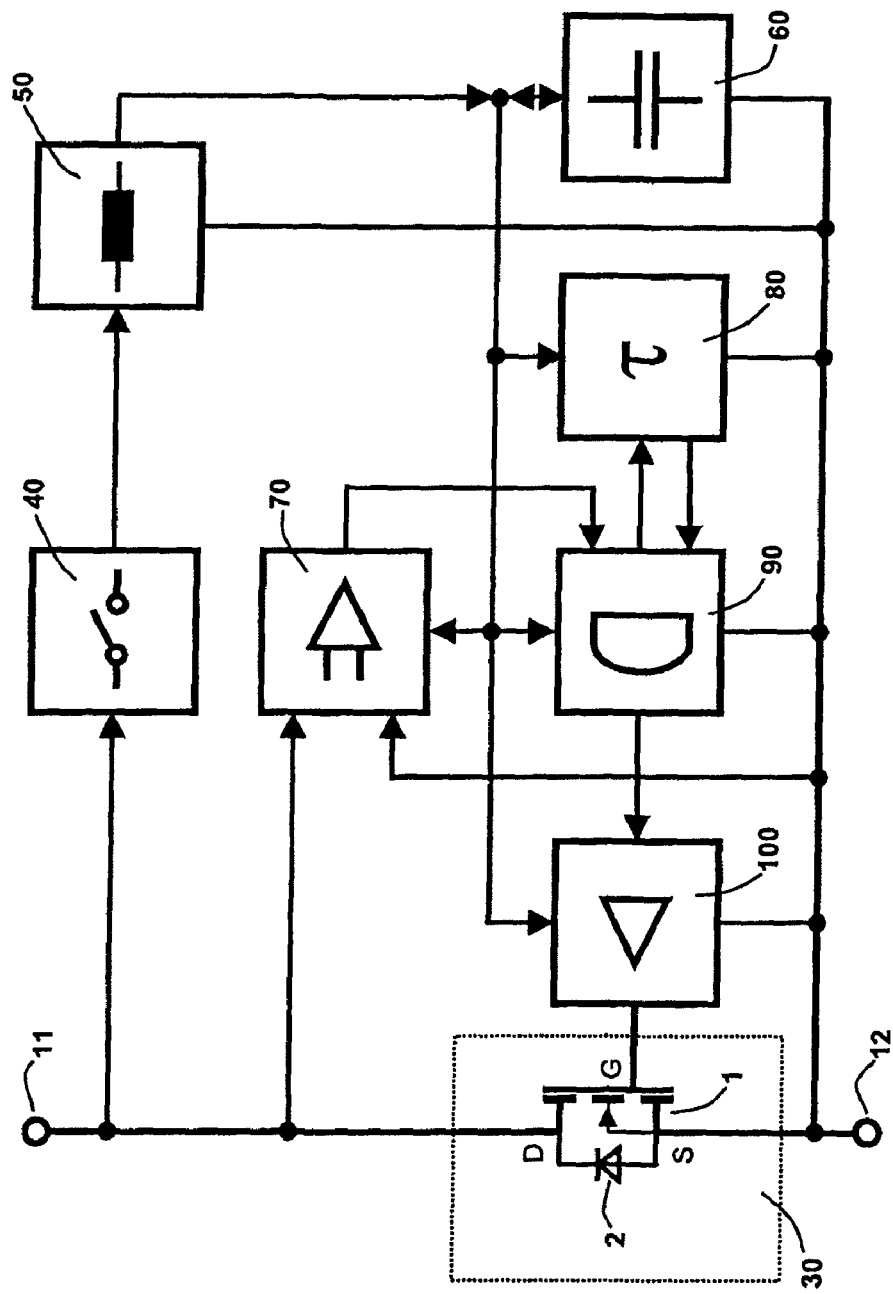
Figure 3:
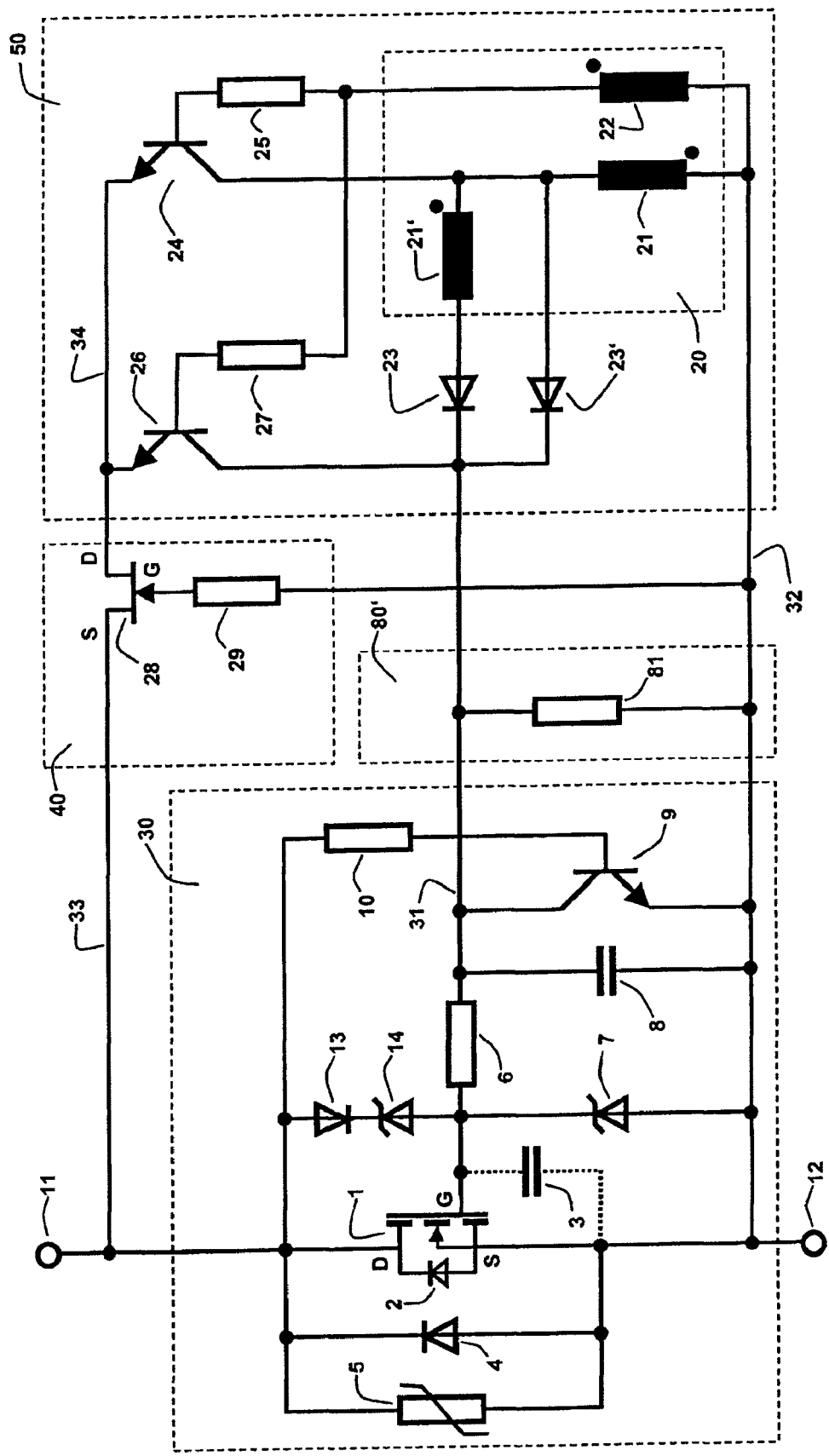
Figure 4:
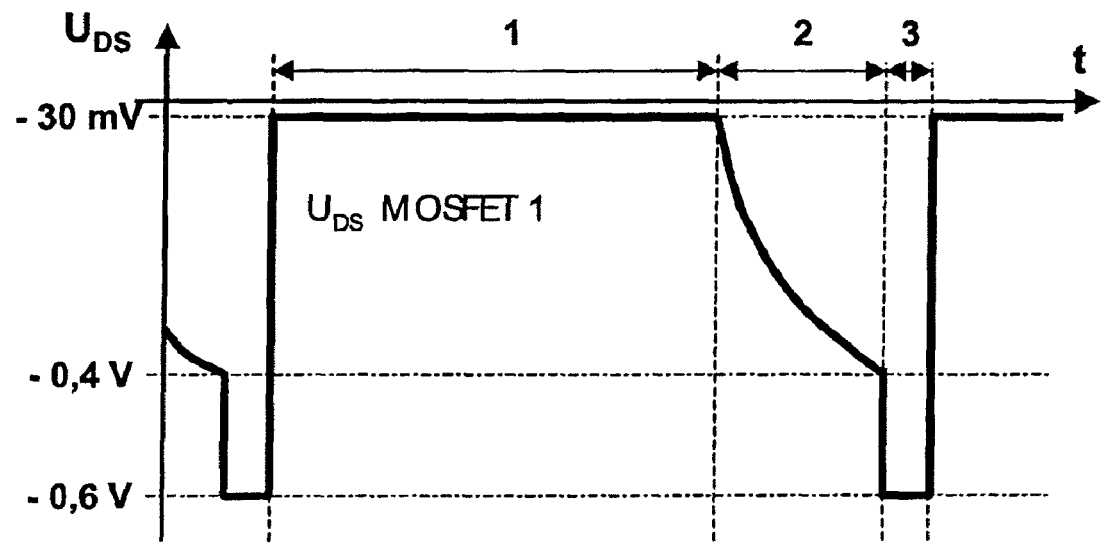
Figure 5:
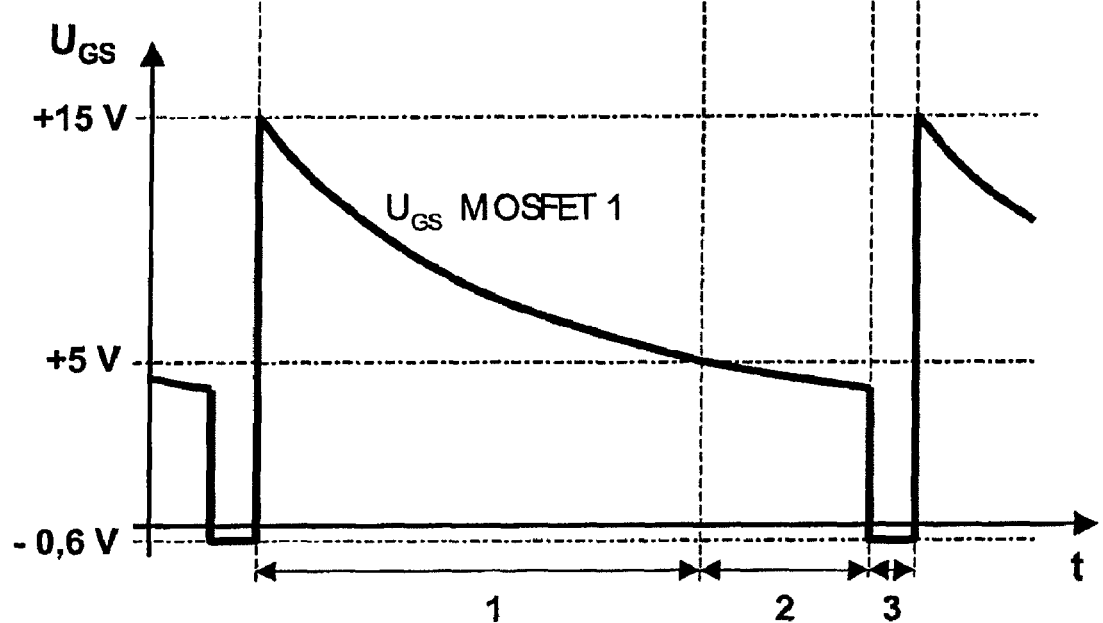
Figure 6:
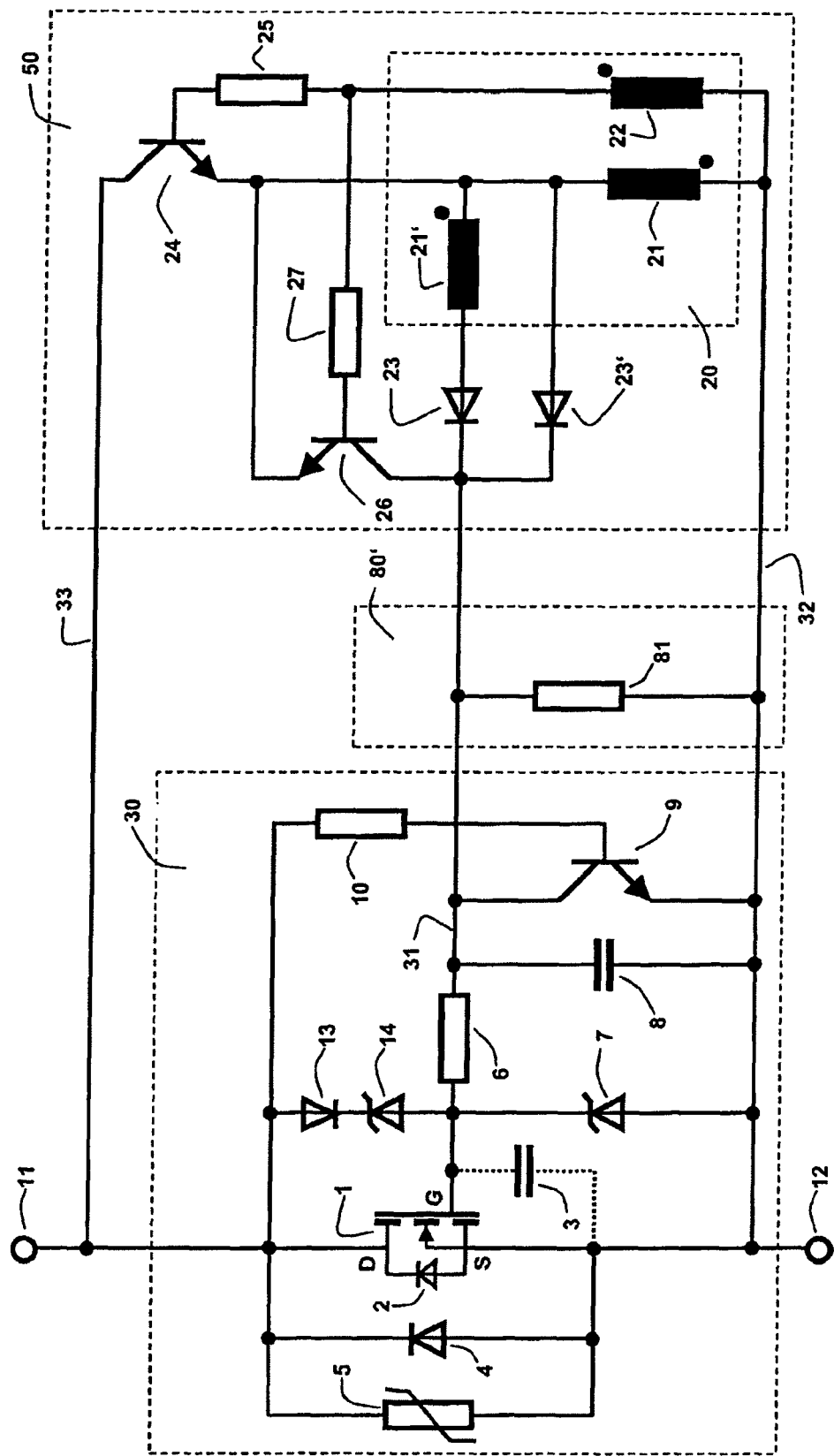
Figure 7:
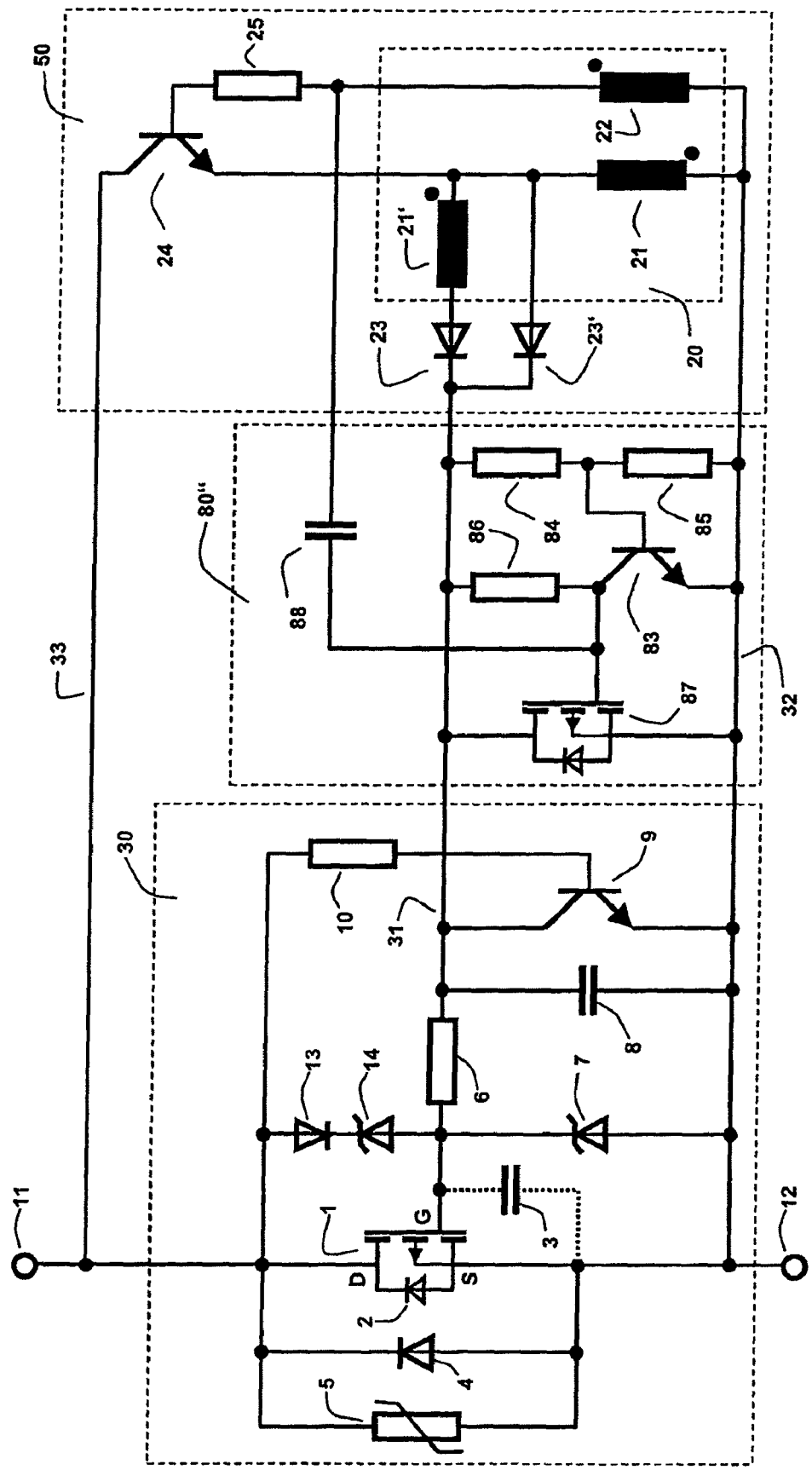
Figure 8:
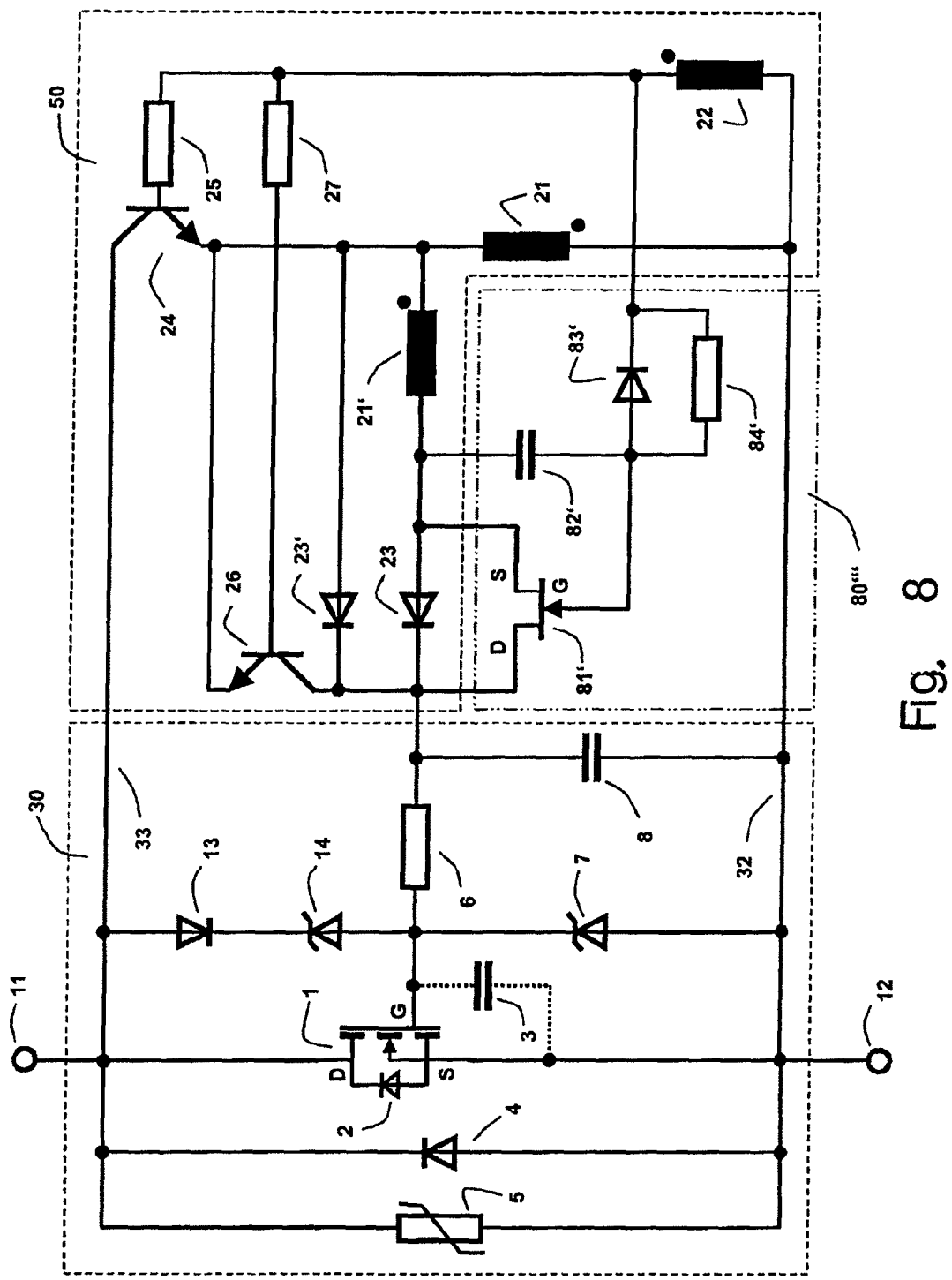
Figure 9:
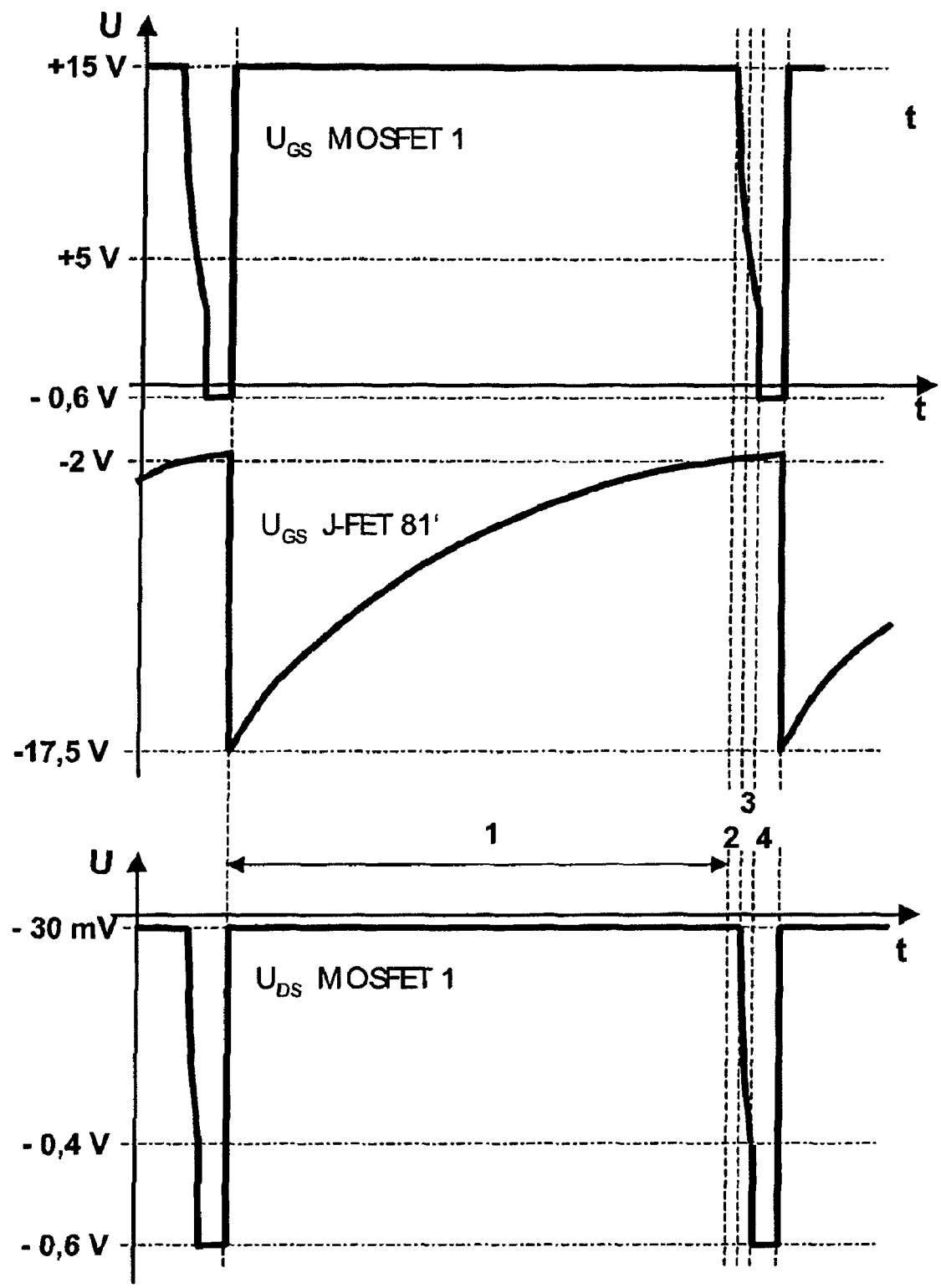

Embodiment examples of the invention are represented in the drawing and are explained in more detail in the subsequently description. There are shown in:

FIG. 1 the circuiting of solar cells and bypass diodes according to the state of the art, as well as the diode voltage in normal operation and with shading, FIG. 2 a block diagram of the protective circuit device according to the invention, FIG. 3 a first design of the protective circuit device according to the invention, with regard to the circuiting, FIG. 4 the temporal course of the drain-source voltage of the controllable bypass element, FIG. 5 the temporal course of the gate-source voltage, FIG. 6 a second design of the switch device according to the invention, with regard to the circuiting, and FIG. 7 a third design of the switch device according to the invention, with regard to the circuiting, FIG. 8 a fourth design of the invention, with regard to the circuiting and FIG. 9 the temporal course of the gate-source voltage of the controllable bypass element and of the gate-source voltage with a self-conducting J-FET, as well as the temporal course of the drain-source voltage of the controllable bypass element.

The protective circuit device represented in FIG. 2 as an essential component comprises a MOS field effect transistor 1 which is component of a switch unit 30 which will be described in more detail later. The drain-source path as a current or switching path lies between the connections 11 and 12 which are connected to the series circuit of the solar cells of the solar module. In normal operation, a positive voltage of 20 V lies at the drain-source path, whilst in the case of shading, a negative drain-source voltage of 0.6 V is present. The inherently present body diode of the MOSFET 1 is indicated at 2. A separating circuit 40, on the one hand is connected to the drain connection of the MOSFET 1, and on the other to a supply circuit and/or charging circuit 50 (hereinafter one speaks essentially of a charging circuit), wherein the separating circuit 40 in normal operation must block the positive drain-source voltage of up to approx. 20 V, whereas in the case of shading it must lead the low, negative voltage of 0.6 V or less, further to the subsequent charging circuit 50 with as little loss as possible.

The charging circuit 50 converts the low, negative direct voltage available behind the separating circuit 40 in the case of shading, into a higher positive voltage required for the activation of the MOSFET 1 and/or for the supply of further circuit parts. Hereby, concepts based on an intermediate storage of energy in a choke coil or a transformer as well as capacitively operating charge pumps may be applied, wherein a preferred embodiment is described later. The converted voltage is intermediately stored in an energy storer 60, which here is drawn as a capacitor, wherein in a particularly advantageous manner, the gate capacitance of the MOSFET 1 is utilised directly as an energy storer.

The gate electrode G of the MOSFET 1 is activated in a time-dependent manner by way of a timer switch 80, wherein the MOSFET is activated over the greatest part of the cycle time for reducing the power loss, as the case may be, operates in a linear manner over a shorter time period and is completely blocked over a shorter time period. The bypass current of the MOSFET 1 then flows through the body diode 2. With the protective circuits according to FIGS. 3, 6 and 7, according to FIG. 5, the gate capacitance of the MOSFET is discharged in the first two time ranges, whilst it is charged via the charging circuit at the end of the first time range. With the protective circuit according to FIG. 8, the discharging according to FIG.

9 is only effected in the time regions 2 and 3, at the end of the fourth time region the capacitance is again charged via the charging circuit.

Preferably, a comparator 70 is provided, which monitors the drain-source voltage and in the permissible condition gives out a signal to the logic circuit 90, which likewise obtains the signal of the timer circuit. Monitoring criteria of the comparator circuit 70 are for example the polarity as well as the magnitude of the drain-source voltage of the MOSFET 1. A driver-circuit 100 which is connected to the supply circuit or charging circuit 50, as to all other circuits, controls the gate of the MOSFET 1 depending on the signal of the logic circuit.

The function blocks represented in the FIG. 2 are cited for an improvement of the overview, and it may be recognised in the further embodiment examples, that all function blocks do not necessarily need to be present separately, and also several functions set by the blocks may be grouped together into a component.

A first embodiment example of the protective circuit device according to the invention, with discrete components, is represented in FIG. 3, wherein the function blocks have been partly represented in a dashed manner. The switch unit 30, as already specified, comprises the MOSFET 1 with the body diode 2, as well as the inherently present gate capacitance 3. A first Zener diode 7 is connected to the gate connection in the forward direction by way of the reference potential lead connected to the connection 12. This diode serves for limiting the gate voltage to a permissible value of e.g. 15 V. A transistor 9 with its current path is connected between the reference potential 32 and the gate control lead 31, and the base of this transistor is connected via a high-impedance resistor 10 to the drain connection of the MOSFET 1. A further capacitor 8 lies parallel to the current path of the transistor 9, and a series resistor 6 is connected in the control lead 31 between the capacitor 8 and the first Zener diode 7. A diode 13 and a second zener diode 14 lie between the drain connection and the gate control lead 31.

A further diode 4 may be circuited parallel to the inherently present body diode 2 of the MOSFET 1, and this diode conducts a part or also the entire bypass current when the MOSFET 1 is not switched on.

An overvoltage protection element 5, e.g. a varistor or a trans-zorb diode lies parallel to the MOSFET 1, and limits extremely high, brief voltage impulses.

The MOSFET with the inherently present body diode 2 is protected from too high voltages at the drain-source path and the gate-source path by way of this protective circuit. Furthermore, on transition into normal operation, i.e. with a positive drain-source voltage, a rapid switching-off is necessary, and furthermore an undesired switching-on of the MOSFET in normal operation should be prevented.

With a positive drain-source voltage, i.e. with the transition into normal operation, the transistor 9 is completely activated via the high-impedance base series resistor 10 and discharges the gate capacitance 3 of the MOSFET 1 very quickly (positive feedback) via the low-impedance series resistor 6. The transistor continues to keep the gate-source voltage across the series resistor 6 to almost 0 V in normal operation. An undesired switch-on, e.g. by way of a gate voltage induced externally, is reliably prevented by way of this. The waste current flowing away via the base series resistor 10 is negligibly small in normal operation.

Basically, MOSFETs are avalanche resistant to a certain extent, i.e. on exceeding the maximal permissible drain-source voltage for a brief period, i.e. larger than 60 V, with a MOSFET specified for 40 V, the MOSFET becomes conducting and limits the voltage peak without assuming damage. With this operation type, one may however leave the reliable operating range, and the component may be subjected to an increased stress. For this reason, with the occurrence of an excess voltage, the MOSFET is activated via its gate-source path in a targeted manner, via the zener diode 14 and the diode 13, wherein on exceeding the Zener voltage of the Zener diode 4, the gate is lifted to a positive potential and the MOSFET 1 is operated in a linear range. The series resistor 9 is necessary, in order to be able to build up a positive gate voltage given a conducting transistor 9

The capacitor 8 which is connected in parallel to the inherently present gate capacitance 3 via the series resistor 6, and which typically has a greater capacitance that the gate capacitance 3, reduces the proneness of the circuit to disturbance. The capacitor is advantageously connected at the side of the series resistor 6 which is distant to the gate, since then only the comparatively low gate capacitance 3 needs to be charged via the Zener diode 4 and the diode 13 in the case of a transient overvoltage.

As has already been specified above, the separating circuit 40 has the task of separating the positive drain-source voltage of 20 V in normal operation, from the subsequent circuit and to lead the negative drain-source voltage of 0.6V in the case of shading, further to the subsequent circuit parts. The separating circuit 40 represented in FIG. 3 comprises a self-conducting n-channel junction (J-FET) 28, whose source electrode is connected to the drain connection of the MOSFET 1, whose drain electrode is connected to the subsequent supply circuit or charging circuit 50, and whose gate electrode is connected to a reference potential lead 32 via a high-impedance gate resistor 29. This resistor 29 limits the current through the gate diodes with a positive gate-drain voltage or gate-source voltage larger than 0.5 V, as occurs in the case of shading. For blocking, the low-impedance J-FET 28 requires a gate voltage of approx. 5 V which is negative with respect to the drain as well as the source. This is achieved in a direct manner for the source-gate path in normal operation. In contrast, for the drain-gate path, this may only be achieved if the drain potential assumes a positive value. It is necessary for this, for the subsequent supply circuit and charging circuit 50 to accommodate a reverse voltage of the magnitude of the threshold voltage of the J-FET, thus about 5 V. This particular characteristic is ensured by the charging circuit 50 described below.

Instead of the described J-FET 28, one may also apply a self-conducting MOSFET, which has a similar behaviour, wherein then however a current limitation via the resistor 29 is not necessary, since the gate insulation may typically accommodate ±20 V.

The supply circuit and/or charging circuit 50 has the task of converting a negative input voltage of 0.6 V into a positive output voltage of e.g. 15 V which is sufficient for the activation of the MOSFET. A secure starting at voltages of even smaller than 0.4 V must be ensured whilst taking into account the voltage drop over the body diode 2 of the MOSFET 1, which reduces with an increasing temperature, as well as possibly occurring voltage drops in the separating circuit 40. The charging circuit must be very robust and be created with little effort. It additionally assumes the functions of the comparator 70, as well as partially of the timer circuit and driver circuit 80, 100 of FIG. 2.

The charging circuit 50 according to FIG. 3 comprises a transistor 24 which is operated in an emitter circuit 24, and whose emitter is connected to the drain connection of the J-FET 28, and whose collector is connected to the primary winding 21 of a transformer 20. The base of the transistor 24 is connected to a positive feedback winding 22 via a series resistor 25. An output winding 21' lies in series with the primary winding 21, by which means the transformer 20 is connected as an auto-transformer. The collector of the transistor 24 is connected between the primary winding 21 and the output winding 21'. The output winding 21' is connected to the gate capacitance 3 or directly to the additional capacitor 8, via a rectifier diode 23 and the series resistor 6. A further diode 23' connects the end of the primary winding to the additional capacitor 8.

Additionally, the charging circuit 50 comprises a transistor 26, whose emitter is connected to the drain connection of the J-FET 28, whose collector is connected between the diode 3 and the series resistor 6, and whose base is connected via the series resistor 27 to the connection of the positive feedback winding 22.

A discharging resistor 81 which may be a component of a timer circuit 80', is connected between the reference potential lead 32 and the gate control lead 31.

The manner of functioning, in particular of the supply circuit or charging circuit, as well as the switching behaviour of the MOSFET 1 is described with reference to the time-dependent voltage courses according to FIGS. 4 and 5. Given a shading and a switched-on MOSFET 1, a negative voltage of a few millivolts, e.g. −30 mV drops over the drain-source path, depending on the switch-on resistance (RDSon) of the MOSFET 1 and the momentary solar generator current. This is indicated in FIG. 4 in the region (1). Since the voltage which is then provided via the separating circuit 40 is not sufficient, the supply circuit 50 is accordingly not active. The discharging resistor 81 slowly e.g. within 100 ms (region (1)), discharges the gate capacitance 3 of the MOSFET 1 which according to FIG. 4 was charged to 15 V for example. If the threshold voltage of the MOSFET 1 is reached with e.g. a 5 V gate-source voltage, then this goes over from the completely activated region into the linear region (region (2)), and the drain-source voltage slowly increases according to FIG. 4. Without the recharging of the gate-source capacitance 3 via the charging circuit 50 which is described further below, the MOSFET 1 would go over into the completely blocked condition, wherein the solar generator current in this case flows completely through the body diode 2, together with a negative voltage drop of approx. 0.4 V to approx. 1 V.

With a voltage of approx. 0.3 V to 0.4 V between the lead 34 and the reference potential lead 32, i.e. the drain connection of the separating circuit 40, an adequately large base current flows in the transistor 24, in order to cause a noticeable collector current, and thus current thought the primary winding 21 of the transformer 20. By way of this, a voltage is induced in the positive feedback winding 22 which on account of the winding direction adds to the voltage between the leads 32 and 34, and thus amplifies the base current, by which means a rapid transition sets in. The transistor 24 becomes completely conductive, and a temporally increasing primary current builds up according to the inductance of the primary winding 21 and according to the voltage prevailing across the primary winding which essentially corresponds to the voltage prevailing between the leads 32 and 34.

If the core of the transformer 20 gets into saturation, or if the base current of the transistor 24 is no longer sufficient for the complete activation, then the positive feedback reverses and the transistor 24 is abruptly blocked. The energy stored in the transformer inductance is transmitted into the gate capacitance 3 as well as the additional capacitor 8 via the primary winding 21, as well as the output winding 21'. This may be recognised at the end of the region (3) or at the beginning of the region (1) of the FIGS. 4 and 5. The MOSFET 1 thus switches on, and, as described, only has a negative voltage drop of a few millivolts according to its internal resistance. The charging circuit 50 is then not adequately supplied with voltage and is not active. The transformer 20 is dimensioned such that the energy stored in it is sufficient, already with one transformer clock, to charge the gate capacitance 3 or the capacitor 8 to the nominal value of e.g. 15 V.

With a real transformer, the unavoidable leakage induction of the transformer winding 21 with a rapid switching-off of the transistor 24, leads to an overvoltage peak 24 at the transistor 24, which may damage this. The diode 23' prevents this peak, in that it permits the current flowing in the transformer winding at the moment of switching-off, to flow further into the capacitor which is then uncharged.

Once again, it is to be pointed out that "clock" always relates to the charging circuit 50 and the term "cycle" always to the total circuit. The charging cycle consists of two phases: the first phase has been described above and it begins and extends over the duration of the region (3) of the complete total cycle. The rapid transition itself only last as few μs and the essential part of the time lies in the "slow" rise of the current up to the end of the region (3). The second clock phase then sets in, in which the energy is transmitted from the transformer to the capacitances. This procedure lies on the falling flank, thus partly in the region (3) and in the region (1) of the subsequent cycle. This charging-over procedure however as a whole also only last a few μs.

As is evident from the described manner of functioning, the transistor 24 with its base-emitter path, apart from the switching function, also assumes the function of the comparator 70 of FIG. 2, i.e. it only operates when the prevailing drain-source voltage is large enough. Advantageously, the transistor 24 is therefore thermally coupled to the MOSFET 1. Since both components are based on silicon technology, the forward voltages of the body diode and also of the base-emitter diode are in the same directions, so that a secure functioning of the circuit is ensured at all temperatures.

If the negative drain-source voltage of the MOSFET, or the voltage provided to the charging circuit 50 is not sufficiently large e.g. on account of the internal resistance of the separating circuit 40, the rapid transition described above or the transformer clock which is given by the region, does not necessarily take its course in a complete manner. Thus it is particularly with small solar generator currents, that the gate capacitance 3 of the MOSFET 1 or of the capacitor 8 may not be fully charged.

In order to additionally ensure a stable operation of the protective circuit device, when the rapid transition sets in, the gate of the MOSFET 1 is very quickly discharged via the transistor 26 which is then switched on, as may be recognised from FIG. 5, region (3). The MOSFET 1 momentarily blocks, and the drain-source voltage increases according to FIG. 4 very quickly from approx. −0.4 V, the threshold value of the rapid transition, to approx. −0.6 V, the forward voltage of the body diode 2. Thus, an additional positive feedback arises by way of the transistor 26. In the second phase of the transformer clock, the transistor 26 is completely blocked via the then negative voltage at the positive feedback winding 22, so that the gate capacitance 3 or the capacitor 8 may be charged.

The total cycle of the circuit according to FIG. 3, according to the FIGS. 4 and 5, is composed of a first long phase (100 ms) in which the MOSFET 1 is completely activated, of a second shorter phase (20 ms), in which it comes into the linear region and the drain-source voltage slowly increases to approx. −0.4 V, and of a third shorter phase, in which it is completely switched off for a short time (e.g. 1 ms) by way of the positive feedback circuit. The quantity of heat arising in the second and third phase however represents no problem whatsoever and may be led away in a conventional manner.

As has already been specified several times, in normal operation of the module, the drain-source voltage of the MOSFET increases to positive values of approx. 15 V to approx. 20 V. In order for the J-FET 28 applied in the separating circuit 40 to block, its drain connection as well as its source connection must be about 5 V positive with respect to the gate connection, otherwise a leakage current which is not permissible would flow into the charging circuit 50. Since, with the circuit according to FIG. 3, the emitter-base paths of the transistors 24 and 26 for positive voltages lie at the lead 34 in the blocking direction and they may also accommodate a reverse voltage of up to approx. 5V, the drain potential of the J-FET 28 may increase to 5 V and with this, completely block the J-FET 28 as required.

A further embodiment example is represented in FIG. 6, which, as a simplification of the circuit represented in FIG. 3, is achieved by way of grouping together the functions of the separating circuit 40 and of the transistor 24 of the supply circuit or charging circuit 50. Otherwise, the circuit according to FIG. 3 and the voltage diagrams according to FIGS. 4 and 5 may be applied.

As may be recognised, the transistor 24 is operated in an inverse manner. If with a bipolar transistor, the emitter and collector are exchanged, then the basic transistor characteristics are retained, but in inverse operation the current amplification is reduced roughly by the factor 30. This characteristic is taken into account by way of a suitably low-impedance base series resistance 25. In practice, under certain circumstances, the ohmic resistance of the positive feedback winding 22 is already sufficient for limiting the current, so that no component 25 needs to be applied. The inverse operation of the transistor 24 entails the enormous advantage that this is operated in normal operation of the solar module in the collector circuit, wherein its base and also the emitter lie at the reference potential 32 with regard to d.c. voltage. The transistor may accommodate the occurring voltage of 20 V without any problem in this operating mode, and it is also possible to apply a transistor type which is voltage-resistant, which is more capable of withstanding any excess voltage pulses. An oscillation of the supply circuit or charging circuit is ruled out on account of the positive feedback winding which in this operating case acts as a feedback.

The transistor 26 continues to be operated conventionally and its function corresponds to that in FIG. 3. Its emitter however is connected to the emitter of the transistor 24. With this, in the connected-through condition of the transistor 24, the gate of the MOSFET 1 may be discharged rapidly via the transistor 26, wherein with this type of circuiting, it does not need to accommodate any negative reverse voltages in the conducting phase of the MOSFET 1 and also in normal operation of the module.

As described above, with the circuits corresponding to FIG. 3 and FIG. 6, the necessary energy for charging the gate capacitance 3 or the capacitance 8 is transmitted in a single clock pulse, i.e. in a single rapid transition of the transducer transformer 20 and of the transistor 24. The charging circuit may however also transmit the energy in several clock pulses, wherein the gate capacitance of the MOSFET 1 or an energy storer charges in several clock pulses, and the switches off.

Finally, the already mentioned incomplete charging procedure of the gate capacitance or of the capacitor 8 may in principle also be imposed by way of a suitable dimensioning, e.g. of the base series resistor 25, in order to achieve the permanent linear region of the MOSFET 1. In this operating mode, the transistor 24 serves as a regulator for the drain-source voltage. The MOSFET 1 with this is not completely activated, but is kept as a regulator in linear operation via the transistor 24. Thereby, in the case of shading, a negative voltage of approx. 0.3 V to 0.4 V drops across the drain-source path, which is sufficient to let the supply circuit or charging circuit 50 continuously run. With this concept, the losses within the MOSFET 1 are larger than with a completely connected through MOSFET. It is however advantageous that no jumps occur in the solar generator voltage or the solar generator current with this linearly operating MOSFET.

In order to further reduce the occurring power loss within the MOSFET 1, the temporary operation in the linear region of the MOSFET corresponding to the region (2) in FIGS. 4 and 5 may be prevented. Such a circuit is represented in FIG. 7 which differs from the circuit according to FIG. 3 or FIG. 6 by the discharge circuit indicated at 80". With the circuits according to FIG. 3 and FIG. 6, the switch-off point in time of the MOSFET 1 is determined by the time element which is formed by its gate capacitance 3, by the capacitor 8 which is present as the case may be, as well as by the discharge resistance 81. In place of the discharge resistance 81, one applies an active gate discharge circuit acting in a non-linear manner. This has the characteristic of it having a high impedance above a certain threshold voltage, but of having a significant lower impedance on falling short of the threshold voltage. A circuit with this characteristic may e.g. be realised by a Schmitt trigger circuit. If the rapid transition point of this trigger circuit, i.e. the rapid transition threshold of the gate discharge circuit 80" is applied higher than the highest gate voltage required for the complete activation of the MOSFET, e.g. to 6 V or larger, then this, after charging by the charging circuit 50, will firstly reduce rapidly and trigger a new charging clock pulse. The operation of the MOSFET 1 in the linear region which is indicated in FIGS. 4 and 5 with the region (2), is avoided, and the power loss reduced further with such a circuit.

With this circuit 80", a small-signal MOSFET 87 is connected between the gate control lead 31 and the reference potential lead 32, whose gate connection is connected to the collector of a transistor 83, whose emitter in turn lies at the reference potential 32. The base connection is connected to a voltage divider 84, 85 between the gate control lead 31 and the reference control lead 32. Finally, a resistor 86 is connected between the lead 31 and the gate connection of the MOSFET 87. A capacitor 88 is connected to the feedfoward winding 22 from the collector connection of the transistor 83.

With high gate voltages of the MOSFET 1, the transistor 83 is completely activated via the voltage divider 84, 85. Its collector potential and thus also the gate potential of the MOSFET 87 therefore lie close to the reference potential 32, and the MOSFET 87 is thus blocked.

The gate capacitance 3 of the MOSFET 1, as well as of the capacitor 8, are slowly discharged via the high-impedance resistances 84, 85 as well as 86. If the gate voltage of the MOSFET 1 falls below a minimum value, then the transistor 83 begins to block, and the gate voltage of the MOSFET 87 increases. If its threshold voltage of e.g. approx. 1 . . . 2 V is achieved with a small signal MOSFET 87, then its drain-source voltage becomes low-impedance, and the gate capacitance 3 or the capacitor 8 are quickly discharged. The base current for the transistor 83 reduces further by way of this, and a rapid transition sets in. This rapid transition is encouraged in that from a certain drain-source voltage of the MOSFET 1, the supply circuit or charging circuit 50 starts operation as described above. Thereby, the voltage at the positive feedback winding 22 increases to positive values in a first clock pulse section. This increase is transferred via the coupling capacitor 88 to the gate of the MOSFET 87, by which means the positive feedback procedure is intensified once again, and the gate capacitance 3 or the capacitor 8 are completely discharged. The MOSFET 1 is very quickly completely blocked by way of this.

The positive feedback branch across the transistor 26 and the series resistance 27 may be done away with on account of the additional positive feedback via the capacitor 88.

In the second phase of the charging clock pulse, the MOSFET 87 is completely blocked via the negative voltage jump at the positive feedback winding 22 transmitted by the capacitor 88, so that the gate-capacitance 3 or the capacitor 8 may be charged again.

FIG. 8 shows a further, particularly advantageous design of the protective circuit. It corresponds essentially to the circuit according to FIG. 6, wherein the transistor as well as the series resistor 10 are done away with, and the passive discharge circuit 80', has been replaced by an active discharge circuit 80'''.

The crux of the active discharge circuit 80''' is the self-conducting J-FET 81'. On the one hand, it replaces the transistor 9 as well as the series resistor 10, in that in normal operation of the solar module, it connects the gate of the MOSFET 1 via the series resistor 6 and the windings 21' and 21 of the transformer, to the reference potential lead 32. An undesired switching-on of the MOSFET 1 due to gate voltages induced externally, or also leakage currents of the diodes 12 and 14, are securely prevented by way of this. On the other hand it permits an optimal activation of the MOSFET 1 according to FIG. 9, which leads to a further reduction of the power loss in the bypass switch element.

In contrast to the previously described circuits, in the circuit according to FIG. 8, the gate of the MOSFET 1 is not discharged by a resistance after the charging procedure, but the gate voltage UGS according to FIG. 9 retains its full value during the complete time period 1. The MOSFET in this time is very low-impedance by way of this, and the power loss is accordingly low. The switch-off point in time of the MOSFET 1 is determined by a time constant of the timer formed by the capacitor 82' and the resistance 84'. In the charging phase of the capacitors 8 and 3 at the end of the time period 4, the capacitor 82' is also charged via the diode 83' to the sum of the voltages at the three windings 21, 21' and 22, in this example to 17.5V. If the voltage of the windings 21 and 21' jumps back to zero after the demagnetization of the transformer 20, then the potential at the gate of the J-FET 81' jumps to a value of −17.5 V. The J-FET is thus completely blocked, and no charge may flow away from the capacitors 8 and 3 in the ideal case. The capacitor 82' is slowly discharged through the resistor 84', e.g. within 100 ms. If the gate voltage of the J-FET 81' reaches its threshold voltage (−2V in this example), then the J-FET becomes low-impedance, and discharges the capacitors 8 and 3 via the windings 21' and 21, by which means the gate voltage UGS of the MOSFET 1 drops very rapidly, which is represented in FIG. 9 in the time section 2. If this voltage falls short of the threshold voltage of the MOSFET 1, then this begins to block, and its drain-source voltage UDS increases rapidly according to FIG. 9, section 3. If a value of approx. −0.4 V is reached, then the rapid transition of the charging circuit 50 sets in, as described with the previous circuits, together with a very rapid further discharging of the capacitors 8 and 3 via the transistor 26. Section 4 follows, in which the transistor 24 is completely conductive and energy is stored in the transformer 20. The renewed charging of the capacitors 8 and 3 as well as 82' is effected at the end of this section.

The power loss with the circuit according to FIG. 8 is once again reduced compared to the other circuits by way of the fact that the MOSFET 1 is completely activated for the greater part of the cycle time, and the time period in the blocking condition makes up less than 1% of the cycled time.

The described circuits may of course all be constructed with complementary semiconductor types.

Apart from the function as a low-loss bypass element, the MOSFET 1 as an additional function may also assume a short-circuiting of the solar generator voltage on installation, in the case of inspection or in the case of fire. For this, via a control lead for example, the gate connections of all MOSFETs within a solar generator are subjected to a control voltage, so that the voltage of each individual module is short circuited. A contact with the live parts and leads to the solar generator which entails no danger, is possible on account of this.

The invention claimed is:

1. A protective circuit device for a single solar cell or a plurality of solar cell, which are connected in series, comprising at least one transistor serving as a controllable bypass element, whose current path may be connected in parallel to the single solar cell or the plurality of solar cells, a supply circuit for preparing a control voltage for activating the control electrode of the bypass element, and a separating circuit for blocking the voltage, lying across the current path of the bypass element in normal operation, towards to the supply circuit, and for switching through the voltage lying across the current path of the bypass element in the case of shading, towards to the supply circuit.

2. A protective circuit device according to claim 1, wherein the supply circuit is designed as a charging circuit for an energy storage, which carries out a conversion of the voltage available in the case of shading, into a higher voltage for the activation of the controllable bypass element.

3. A protective circuit device according to claim 1, wherein the controllable bypass element is designed as a MOS field effect transistor.

4. A protective circuit device according to claim 2, wherein the energy storage is designed as a capacitor and/or as the capacitance inherent of the controllable bypass element.

5. A protective circuit device according to claim 4, wherein a timer circuit is provided, which sets a timing cycle, while the controllable bypass element is completely connected through over a first time region, and is completely blocked over a second time region, wherein the energy storage is charged in a second time region.

6. A protective circuit device according to claim 5, wherein the time cycle comprises a third time region lying between the first and the second time region, within which the controllable bypass element is operated in the linear condition.

7. A protective circuit device according to claim 1, wherein the separating circuit is designed as a field effect transistor.

8. A protective circuit device according to claim 1, wherein the separating circuit is designed as an inversely operated bipolar transistor.

9. A protective circuit device according to claim 1, further comprising a regulating circuit, with which the controllable bypass element may be operated in the linear condition.

10. A protective circuit device according to claim 1, wherein the supply circuit comprises at least one transformer or at least one coil or at least one capacitor for the intermediate storage of energy for boosting the voltage available in the case of shading, for producing the voltage required for activating the controllable bypass element.

11. A protective circuit device according to claim 1, wherein the supply circuit comprises a transformer with a positive feedback winding, and a first electronic switch element, wherein the switch element and the transformer execute a rapid transition similarly to a self-blocking oscillator, with which the energy stored in the transformer is transmitted into the energy storage.

12. A protective circuit device according to claim 11, wherein the first electronic switch element is inversely operated, and simultaneously forms the separating circuit.

13. A protective circuit device according to claim 11, wherein an additional output winding similar to an autotransformer is connected in series to the primary winding.

14. A protective circuit device according to claim 11, wherein the current path of the first electronic switch element lies in series with the primary winding, and the positive feedback winding is connected to the control electrode of the first electronic switch element.

15. A protective circuit device according to claim 11, wherein the supply circuit comprises a rapid discharge circuit, which with the onset of the rapid transition, rapidly discharges the inherent capacitance and, as the case may be, the additional capacitor connected in parallel.

16. A protective circuit device according to claim 15, wherein the rapid discharge circuit comprises a second electronic switch element, whose control electrode is connected to the positive feedback winding and whose current path, proceeding from the connection of the control electrode of the bypass element, lies parallel to the switch of the first electronic switch element or in series with this.

17. A protective circuit device according to claim 1, wherein the control electrode of the controllable bypass element is connected to a first discharge circuit, the time constant of the first discharge circuit being selected such that the ratio of the time of the conductance of the bypass element to that of non-conductance is large, preferably >5.

18. A protective circuit device according to claim 17, wherein the first discharge circuit has a resistor which is connected in parallel to the inherent capacitance of the bypass element and, as the case may be, to a capacitor connected parallel to this inherent capacitance.

19. A protective circuit device according to claim 17, wherein the first discharge circuit is designed as a non-linearly acting active discharge circuit which is high-impedance above a threshold voltage and is low-impedance below the threshold voltage, wherein the threshold voltage is determined by the voltage required for the complete activation of the bypass switch element, at its control electrode.

20. A protective circuit device according to claim 19, wherein the first discharge circuit is designed as a Schmitt-trigger circuit.

21. A protective circuit device according to claim 17, wherein the first discharge circuit comprises a self-conducting J-FET and a network of a diode, capacitor and discharge resistor which form a time element for the periodic switching-off of the controllable bypass element after a defined time.

22. A protective circuit device according to claim 1, wherein a protective circuit with respect to overvoltage as well as undesired switching-on, is assigned to the controllable bypass element.

23. A protective circuit device according to claim 1, wherein for short circuiting a single solar cell or a plurality of solar cells for the purpose of inspection or in the case of fire, the control electrodes of the controllable bypass element is applied to such a voltage, that the bypass element is turned on to conduct.

24. A protective circuit device according to claim 2, wherein the supply circuit or charging circuit comprises at least one transformer or at least one coil or at least one capacitor for the intermediate storage of energy for boosting the voltage available in the case of shading, for producing the voltage required for activating the controllable bypass element.

25. A protective circuit device according to claim 24, wherein the first electronic switch element is inversely operated, and simultaneously forms the separating circuit.

26. A protective circuit device according to claim 24, wherein an additional output winding similar to an autotransformer is connected in series to the primary winding.

27. A protective circuit device according to claim 24, wherein the current path of the first electronic switch element lies in series with the primary winding, and the positive feedback winding is connected to the control electrode of the first switch element.

28. A protective circuit device according to claim 24, wherein the supply circuit comprises a rapid discharge circuit, which with the onset of the rapid transition, rapidly discharges the inherent capacitance and, as the case may be, the additional capacitor connected in parallel.

29. A protective circuit device according to claim 28, wherein the rapid discharge circuit comprises a second electronic switch element, whose control electrode is connected to the positive feedback winding and whose current path, proceeding from the connection of the control electrode of the bypass element, lies parallel to the switch of the first electronic switch element or in series with this.

30. A protective circuit device according to claim 1 wherein the supply circuit comprises a charge pump for boosting the voltage available in the case of shading, for producing the voltage required for activating the controllable by-pass element.

31. A protective circuit device according to claim 2 wherein the charging circuit comprises a charge pump for boosting the voltage available in the case of shading, for producing the voltage required for activating the controllable bypass element.

32. A protective circuit device for a single solar cell or a plurality of solar cells, which are connected in series, comprising:
at least one transistor serving as a controllable bypass element, whose current path may be connected in parallel to the single solar cell or to the plurality of solar cells, and
a supply circuit for preparing a control voltage for activating the control electrode of the bypass element,
wherein the supply circuit comprises a transistor, the transistor being voltage resistant to block the voltage lying across the current path of the bypass element in normal operation.

33. A protective circuit device according to claim 32, wherein the supply circuit comprises at least one transformer or at least one coil or at least one capacitor for the intermediate storage of energy for boosting the voltage available in the case of shading, for producing the voltage required for activating the controllable bypass element.

34. A protective circuit device according to claim 32, wherein the control electrode of the controllable bypass element is connected to a first discharge circuit, the time constant of the first discharge circuit being selected such that the ratio of the time of the conductance of the bypass element to that of non-conductance is large, preferably >5.

35. A protective circuit device according to claim 32, wherein the supply circuit comprises a charge pump for boosting the voltage available in the case of shading, for producing the voltage required for activating the controllable by-pass element.

36. A protective circuit device according to claim 32, wherein for short circuiting a single solar cell or a plurality of solar cells for the purpose of inspection or in the case of fire, the control electrode of the controllable bypass element is applied to such a voltage, that the bypass elements is turned on to conduct.

37. A protective circuit device for a single solar cell or a plurality of solar cells, which are connected in series, comprising:
- at least one transistor serving as a controllable bypass element, whose current path may be connected in parallel to the single solar cell or to the plurality of solar cells,
- a supply circuit configured to prepare a control voltage for activating the control electrode of the bypass element, and
- a regulating circuit configured to operate the controllable bypass element in a linear condition.

38. A protective circuit device according to claim 37, wherein the supply circuit comprises at least one transformer or at least one coil or at least one capacitor for the intermediate storage of energy for boosting the voltage available in the case of shading, for producing the voltage required for activating the controllable bypass element.

39. A protective circuit device according to claim 37, wherein the supply circuit comprises a charge pump for boosting the voltage available in the case of shading, for producing the voltage required for activating the controllable by-pass element.

40. A protective circuit device according to claim 37, wherein for short circuiting a single solar cell or a plurality of solar cells for the purpose of inspection or in the case of fire, the control electrode of the controllable bypass element is applied to such a voltage, that the bypass elements is turned on to conduct.

41. A protective circuit device for a single solar cell or a plurality of solar cells, which are connected in series, comprising:
- at least one transistor serving as a controllable bypass element, whose current path may be connected in parallel to the single solar cell or to the plurality of solar cells,
- a supply circuit configured to prepare a control voltage for activating the control electrode of the bypass element,
- wherein for short circuiting a single solar cell or a plurality of solar cells for the purpose of inspection or in the case of fire, the control electrode of the controllable bypass element is applied to such a voltage, that the bypass element is conductively switched.

* * * * *